US012591017B2

(12) United States Patent
Bharathraj et al.

(10) Patent No.: US 12,591,017 B2
(45) Date of Patent: Mar. 31, 2026

(54) METHOD AND DEVICE WITH BATTERY SHORT CIRCUIT DETECTION

(71) Applicant: Samsung Electronics Co., Ltd.,
Suwon-si (KR)

(72) Inventors: Sagar Bharathraj, Bengaluru (IN);
Shashishekara Parampalli Adiga,
Bengaluru (IN)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 286 days.

(21) Appl. No.: 18/074,969

(22) Filed: Dec. 5, 2022

(65) Prior Publication Data

US 2023/0384389 A1     Nov. 30, 2023

(30) Foreign Application Priority Data

May 24, 2022     (IN) .............................. 202241029825
Jul. 22, 2022     (KR) ........................ 10-2022-0091211

(51) Int. Cl.
*G01R 31/389*     (2019.01)
*G01R 31/3842*     (2019.01)
*H01M 10/48*     (2006.01)

(52) U.S. Cl.
CPC ....... *G01R 31/389* (2019.01); *G01R 31/3842*
(2019.01); *H01M 10/48* (2013.01)

(58) Field of Classification Search
CPC .............. G01R 31/389; G01R 31/3842; G01R
31/392; G01R 31/50; G01R 31/52
See application file for complete search history.

(56) References Cited

U.S. PATENT DOCUMENTS 11,867,765 B2 *   1/2024   Liu .................... G01R 31/3842
2012/0176140 A1   7/2012   Kitsuani et al.
2020/0386828 A1 * 12/2020   Qian ...................... G01R 31/52
(Continued)

FOREIGN PATENT DOCUMENTS

DE     10 2019 134 510 A1     6/2021
JP             4332321 B2     9/2009
JP             6034954 B2     11/2016
(Continued)

OTHER PUBLICATIONS

Machine translation of TW 202132801 (Year: 2021) Printed Dec.
16, 2024.*

(Continued)

*Primary Examiner* — Christopher E Mahoney
(74) *Attorney, Agent, or Firm* — NSIP Law

(57) ABSTRACT

Provided are a method and device with battery short circuit
detection. A method of detecting a short circuit in a battery
includes: triggering a rest phase of the battery, determining
a first time constant related to a rest voltage of the battery
when the battery may be in the rest phase, estimating a first
short-resistance value by comparing the first time constant
with a second time constant related to a voltage of the
battery, and making a short circuit determination for the
battery based on a result of comparing the first short-
resistance value and a second short-resistance value,
wherein the first time constant and the second time constant
may be determined with reference to either a temperature
range or a charging range of the electronic device.

18 Claims, 7 Drawing Sheets

(56) References Cited

U.S. PATENT DOCUMENTS

| | | | |
|---|---|---|---|
| 2021/0239766 A1 | 8/2021 | Talukdar et al. | |
| 2023/0400525 A1* | 12/2023 | Bharathraj | ........... G01R 31/389 |

FOREIGN PATENT DOCUMENTS

| | | | | |
|---|---|---|---|---|
| KR | 10-2012-0068919 A | | 6/2012 | |
| KR | 10-2022-0012003 A | | 2/2022 | |
| KR | 10-2022-0040191 A | | 3/2022 | |
| TW | 202132801 A | * | 9/2021 | ............ B60L 3/0046 |
| WO | WO-2023066616 A1 | * | 4/2023 | ............ B60L 3/0046 |

OTHER PUBLICATIONS

Seo, Minhwan, et al. "Online detection of soft internal short circuit in lithium-ion batteries at various standard charging ranges." *Ieee Access* 8 (Apr. 13, 2020): pp. 70947-70959.
Indian Office Action Issued on Jun. 19, 2025, in Counterpart Indian Patent Application No. 202241029825 (6 Pages in English).
Korean Office Action issued on Jan. 14, 2026, in counterpart Korean Patent Application No. 10-2022-0091211 (3 pages in English, 5 pages in Korean).

\* cited by examiner

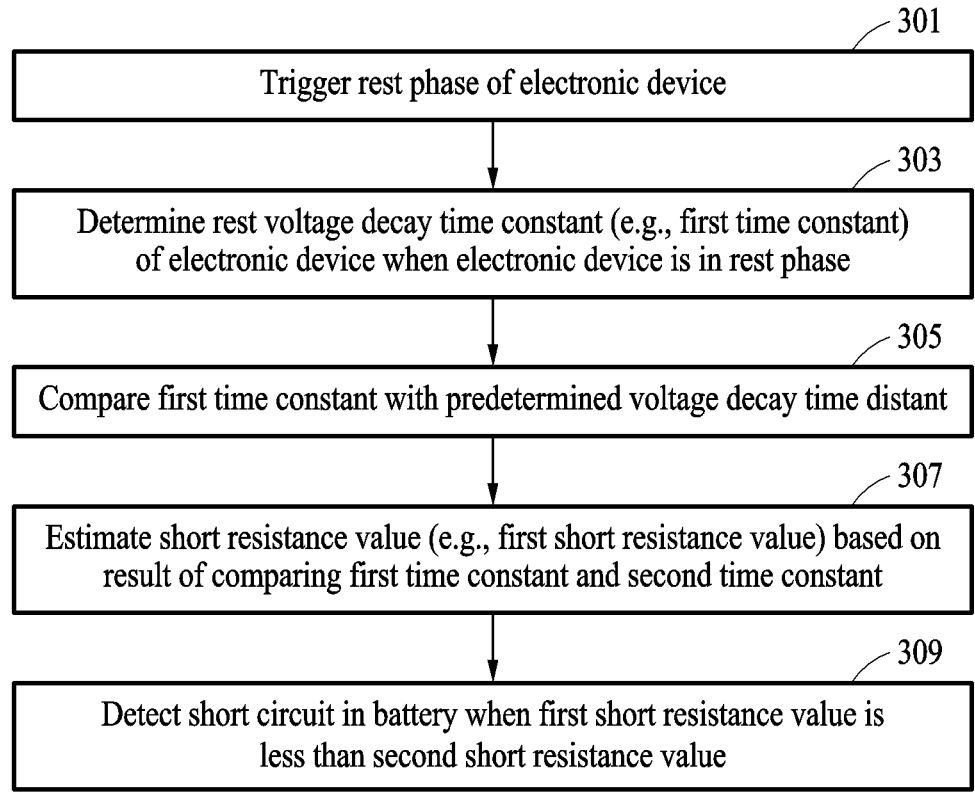

301
Trigger rest phase of electronic device

303
Determine rest voltage decay time constant (e.g., first time constant) of electronic device when electronic device is in rest phase 305
Compare first time constant with predetermined voltage decay time distant 307
Estimate short resistance value (e.g., first short resistance value) based on result of comparing first time constant and second time constant 309
Detect short circuit in battery when first short resistance value is less than second short resistance value

METHOD AND DEVICE WITH BATTERY SHORT CIRCUIT DETECTION

CROSS-REFERENCE TO RELATED APPLICATIONS

This application claims the benefit under 35 USC § 119(a) of Indian Patent Application No. 202241029825 filed on May 24, 2022, at the Indian Patent Office, and Korean Patent Application No. 10-2022-0091211 filed on Jul. 22, 2022, at the Korean Intellectual Property Office, the entire disclosures of which are incorporated herein by reference for all purposes.

BACKGROUND

1. Field

The following description relates to a method and device with battery short circuit detection.

2. Description of Related Art

Many consumers are using electronic devices such as mobile phones, laptop computers, tablets, and smart watches. Usually, rechargeable batteries (e.g., lithium (Li) ion batteries) are used to provide portable electricity and power to electronic devices. Also, there are electric vehicles which use electrical energy stored in rechargeable batteries. However, rechargeable batteries may be susceptible to safety issues caused by an internal short circuit.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Fires in rechargeable batteries may be prevented if short circuits (e.g., 200Ω and above) are detected and estimated at an early stage. However, because a short/soft short such as 300Ω has a very marginal impact on a battery state at an early stage, signs of such short circuit have been indistinguishable from signs of a state of a healthy battery. Hence, it is difficult to detect a short circuit early.

Further, existing methods of detecting a short circuit early are impractical for device implementation, due to computational heaviness and a requirement of months of data accumulation about a battery. In addition, such existing methods may only predict a short (e.g., 100Ω and below) at a late stage. Further, such existing methods lack accuracy. Some examples and embodiments described herein may provide early detection of a short circuit in a battery of an electronic device with reference to either a temperature range or a charging range of the electronic device.

The technical goals to be achieved are not limited to those described above, and other technical goals not mentioned above will be clearly understood by one of ordinary skill in the art from the following description.

In one general aspect, a device includes one or more processors, a memory storing instructions configured to cause the one or more processors to: trigger a rest phase of a battery, determine a first time constant related to a rest voltage of the battery, wherein the rest voltage is determined while the battery is in the rest phase, estimate a first short-resistance value based comparing the first time constant with a second time constant related to a voltage of the battery, and make a determination indicating a short circuit in the battery based on comparing the first short-resistance value and a second short-resistance value, wherein the first time constant and the second time constant are each determined with reference to either a temperature range or a charging range of the battery.

The instructions may be further may be configured to cause the one or more processors to trigger the rest phase in response to a user input, or trigger the rest phase based on a triggering time period.

The instructions may be further may be configured to cause the one or more processors to determine the first time constant based on voltage information of the rest phase during obtained during an evaluation time period of the rest phase.

The instructions may be further may be configured to cause the one or more processors to determine the first time constant by comparing the voltage of the electronic device with a maximum voltage in the evaluation time period.

The instructions may be further may be configured to cause the one or more processors to estimate a short-resistance value based on the first time constant when the first time constant is greater than the second time constant.

The rest phase may correspond to either the battery not supplying current to the electronic device, or the battery supplying current to the electronic device that may be less than or equal to a predetermined threshold.

The rest phase may be either a charging state or a discharging state.

The instructions may be further configured to cause the one or more processors to make the determination indicating a short circuit in the battery when the first short-resistance value is less than the second short-resistance value.

In one general aspect, a method of detecting a short circuit in a battery includes: triggering a rest phase of the battery, determining a first time constant related to a rest voltage of the battery when the battery may be in the rest phase, estimating a first short-resistance value by comparing the first time constant with a second time constant related to a voltage of the battery, and making a short circuit determination for the battery based on a result of comparing the first short-resistance value and a second short-resistance value, wherein the first time constant and the second time constant may be determined with reference to either a temperature range or a charging range of the electronic device.

The rest phase may be triggered on-demand based on a user input.

The first time constant may be determined based on voltage information of the rest phase during an evaluation time period related to voltage information.

The first time constant may be determined by comparing the voltage of the electronic device with a maximum voltage in the evaluation time period.

Maximum voltage may be measured from the battery at the beginning of the evaluation time period.

The rest phase may include a period of time defined by ending charging of the battery based on starting of the rest phase.

The rest phase may include an initial phase, and wherein the maximum voltage may be measured based on the ending of the initial phase.

The making the short circuit determination for the battery may be based on the first short-resistance value being less than the second short-resistance value.

A method may include while a battery may be being charged or discharged, determining to make a short circuit estimation thereof, and based thereon starting a rest phase for the battery, during the rest phase, after the charging or discharging may be ended, determining voltage information during the rest phase, based on the voltage information, and based on range, determining that a short circuit condition exists in the battery, wherein the range may include a temperature range of the battery or a charging range of the battery.

The voltage information may include a maximum voltage value and a voltage value, both measured during the rest phase.

The method may further include computing resistance values based on the range, and determining that the short circuit condition exists based on comparing the resistance values.

Other features and aspects will be apparent from the following detailed description, the drawings, and the claims.

BRIEF DESCRIPTION OF THE DRAWINGS

FIG. 3 illustrates an example of detecting a short circuit in a battery, according to one or more embodiments.

Figure 1:
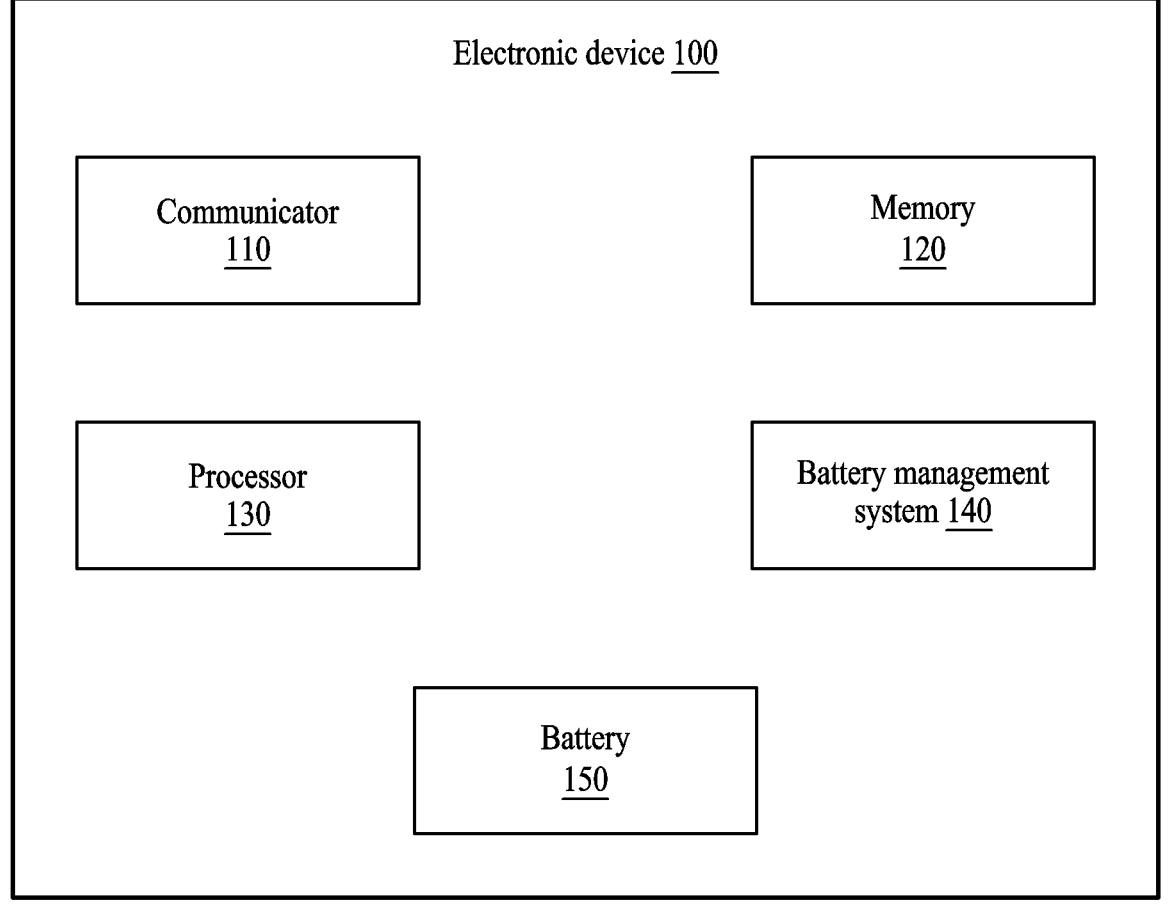
FIG. 1 illustrates an example of an electronic device for detecting a short circuit in a battery, according to one or more embodiments.

Throughout the drawings and the detailed description, unless otherwise described or provided, the same drawing reference numerals will be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

FIG. 1 illustrates an example of an electronic device for detecting a short circuit in a battery.

Referring to FIG. 1, an electronic device 100 (e.g., a wireless device) may include a communicator 110, a memory 120, a processor 130, a battery management system (BMS) 140, and a battery 150. For example, the electronic device 100 may be, for example, a mobile phone, a smartphone, a tablet computer, a handheld device, a laptop computer, a wearable computing device, an Internet of Things (IoT) device, a digital camera, a vehicle, a drone, and the like. The electronic device 100 may further be, but is not limited to, an apparatus or device (e.g., a battery short circuit detection device, etc.) or a system for detecting a short circuit in a battery pack of an electric vehicle.

The communicator 110 may be configured to enable the electronic device 100 to communicate with an external device (e.g., a printer, a fax machine, etc.) through a network.

The memory 120 may include instructions to be executed by the processor 130, and the processor 130 may be electrically connected to the memory 120 to perform various operations by executing the instructions stored in the memory 120 (multiple processors may be used, and processor 130 is representative of one or more processors). The memory 120 may include one or more of computer-readable storage media. The memory 120 may include non-volatile storage elements (e.g., a magnetic hard disk, an optical disc, a floppy disc, a flash memory, electrically programmable memory (EPROM), and electrically erasable and programmable memory (EEPROM).

The memory 120 may be a non-transitory medium. The term "non-transitory" indicates that a storage medium is not embodied in a carrier wave or a propagated signal. However, the term "non-transitory" should not be interpreted to mean that the memory 120 is non-movable. A non-transitory storage medium (e.g., random access memory (RAM) or a cache memory) may include data that changes over time.

The BMS 140 may be connected with the memory 120, the processor 130, and the battery 150. The BMS 140 may be an electronic system for managing the battery 150. The BMS 140 may manage charging and discharging of the battery 150, provide a notification about a status of the battery 150, provide a warning of a risk such as a short circuit in a battery to protect the battery 150, and the like.

The battery 150 may be a rechargeable battery and may be in a form of a cell or a battery pack. For example, the rechargeable battery may be a lithium-ion battery (LIB).

The components of the electronic device 100 are not limited to the foregoing components. The electronic device 100 may include less or more components. Furthermore, the labels or names of the components are used only for illustrative purpose and do not limit the scope of the electronic device 100.

Figure 2:
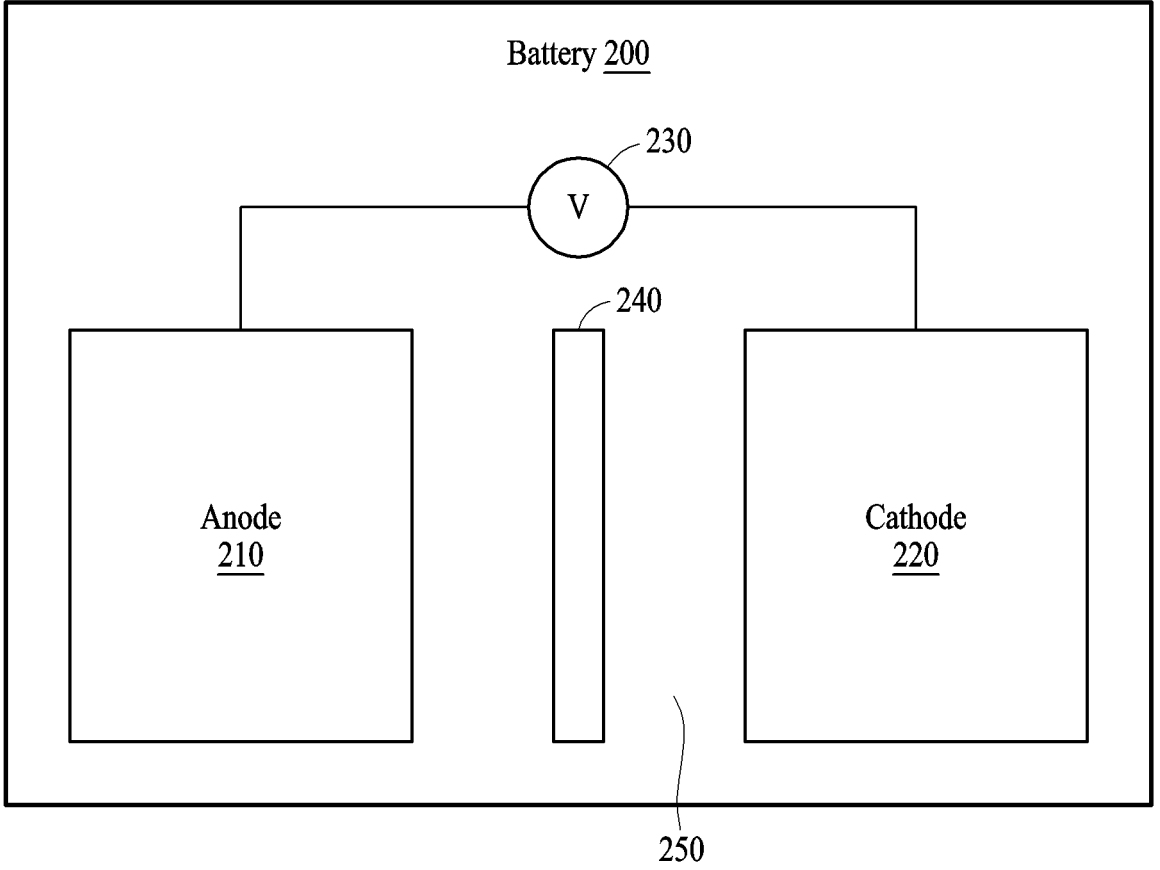
FIG. 2 illustrates an example of a battery included in an electronic device, according to one or more embodiments.

FIG. 2 illustrates an example of a battery included in an electronic device. Referring to FIG. 2, a battery 200 (e.g., the battery 150 of FIG. 1) may be a battery (e.g., a LIB, a lithium-polymer battery, etc.) that includes a membrane (e.g., a separator) for separating a positive electrode and a negative electrode. A shape and size of the battery 200 may depend on a shape, a size, a required power amount, and the like, of an electronic device (e.g., the electronic device 100 of FIG. 1).

The battery 200 may include an anode 210, a cathode 220, a voltage source 230, a separator 240, and an electrolyte 250.

The battery 200 may supply power to components (e.g., the communicator 110, the memory 120, the processor 130, and the BMS 140 of FIG. 1) of the electronic device 100.

The anode 210 may be an electrode through which a positive current flows into a polarized electronic device. A shape and size of the anode 210 may depend on the shape and size of the battery 200, and the anode 210 may be made of various materials.

The cathode 220 may be an electrode through which the positive current flows out of the polarized electronic device. A shape and size of the cathode 220 may depend on the shape and size of the battery 200, and the cathode 220 may be made of various materials.

The voltage source 230 may be used to charge the battery 200, and may be, for example, a terminal connectible with an external charger (an external power source) to charge the battery 200, a circuit for charging the battery 200 by electromagnetic induction, and so forth.

The separator 240 may separate the anode 210 and the cathode 220 and include a membrane (e.g., a microporous membrane). A shape and size of the separator 240 may depend on the shape and size of the battery 200.

The electrolyte 250 may be any liquid substance that acts as a medium to conduct electricity between the anode 210 and the cathode 220 and store energy in the anode 210 and the cathode 220. The composition of the electrolyte 250 may vary depending on a type and purpose of the battery 200. The battery 200 in FIG. 2 is an example configuration and the battery 200 is not necessarily limited thereto; the battery 200 may have different numbers and different types of components.

To reduce the chance of safety issues arising due to a short circuit of the battery 200, a potential short circuit in the battery 200 may be detected or predicted early based on operations described with reference to FIGS. 3 through 5. Although methods are described herein as detecting a short circuit, it will be appreciated that such detection may be an inferential result of any of the methods; an actual short circuit may or may not exist or occur.

FIG. illustrates an example of detecting a short circuit in a battery. Referring to FIG. 3, a system (e.g., a system 400 of FIG. 4) may be, or be included in, a BMS (e.g., the BMS 140 of FIG. 1) or a system included in an electronic device (e.g., the electronic device 100 of FIG. 1) and connected with the BMS 140. For convenience, power-related aspects of the electronic device 100 (e.g., voltage, current, charging/discharging state, etc.) are described below with reference to the electronic device 100, however, depending on context, references to such power-related aspects of the electronic device 100 should be considered as specifically referring to the battery of the electronic device 100. For example, mention of voltage of the electronic device 100 refers to voltage of the battery of the electronic device 100.

For short circuit detection, the system 400 may trigger 301 a rest phase of the electronic device (e.g., the electronic device 100 of FIG. 1). While the electronic device 100 is in a switched-off mode for the rest phase, a current value (I) (current drawn from the battery) of the device may be "0", for example. While the electronic device 100 is in a flight mode or an idle mode for the rest phase, for example (or another low-power mode), the current value (I) may be less than a predetermined threshold, for example. The predetermined threshold may be $\frac{1}{20}$ of a maximum current value, for example, although the exact ratio for the threshold will vary according to the implementation. In sum, the rest phase may be a phase when no current is drawn from the battery or when a relatively low (below threshold) current is drawn from the battery. In some embodiments, triggering a rest phase may coincide with, or cause, placing the device in a state corresponding to little (below the threshold) or no current consumption from the battery.

A triggering unit (e.g., a triggering unit 410 of FIG. 4) may trigger the rest phase. The rest phase may be triggered in response to an input received from a user of the electronic device 100. That is, the user may voluntarily and interactively trigger the rest phase. In addition, or alternatively, the triggering unit 410 may trigger the rest phase based on a predetermined time period or interval (e.g., a triggering time period). For example, the triggering unit 410 may trigger the rest phase for each predetermined time period/interval (e.g., every week, every 10 days, every month, etc.). The predetermined time period may be determined by the triggering unit 410 or the user. The rest phase may also be triggered responsive to any relevant events, e.g., a change in a power or operation mode of the electronic device, detecting a period without user interaction, etc.

The triggering unit 410 may trigger the rest phase while the electronic device 100 is in either a battery charging state/mode or a battery discharging state/mode, e.g., being used by the user or an application is running in the foreground or background. Additionally, or alternatively, the rest phase may be triggered while the electronic device 100 is in the charging state and the battery is being charged in a constant voltage (CV) phase. The rest phase may also be triggered while the electronic device 100 is in the charging state and the battery is being charged in a constant current (CC) phase.

While the electronic device 100 is in the rest phase, the system 400 may determine 303 a rest voltage decay time constant $\tau$ (e.g., a first time constant) of the electronic device 100. As described below, first rest voltage decay time constant $\tau$ (e.g., a first time constant) can be compared to a second rest voltage decay time constant $\tau$ to predict a battery short circuit. The second rest voltage decay time may be determined in advance and, in some implementations, may be reused for different detection cycles of different rest phases.

During the rest phase, a determining unit 412 may collect voltage information during a predetermined evaluation time period. For example, the evaluation time period may be five minutes. The voltage information may include/indicate a voltage increase if the rest phase begins while the electronic device 100 is being charged, and may include/indicate a voltage decrease if the rest phase begins while the electronic device 100 is being discharged. When the rest phase is triggered while the electronic device 100 is in the charging state, the voltage information may be collected after the electronic device 100 is charged to 100%. When the rest phase is triggered while the electronic device 100 is being charged in the CC phase, voltage information for an initial time (e.g., two minutes) may be discarded (or not collected) and only voltage information collected after the initial time may be used to determine the rest voltage decay time constant $\tau$ (e.g., the first time constant). The initial time may be predetermined by the triggering unit 410 ("predetermined" means only that the initial time is determined some time before it is used).

The determining unit 412 may determine the rest voltage decay time constant $\tau$ (e.g., the first time constant) based on the voltage information of the electronic device 100, which may include (i) a maximum voltage (e.g., $V_{t=0}$ below) within an evaluation time period (a time period after the initial time), and a later voltage measure taken when the evaluation time period ends (e.g., $V_{t=5}$, below). For example, the determining unit 412 may determine that a time taken for the voltage of the electronic device 100 to drop to 63.2% from the maximum voltage within the evaluation time period (e.g., five minutes) is the first time constant. The rest voltage decay time constant $\tau$ (e.g., the first time constant) may be determined as a time constant according to a voltage defined by Equation 1.

$$V = V_{t=0} - 0.63 * (V_{t=0} - V_{t=5\ min})$$ <span style="float:right">Equation 1</span>

V denotes a voltage according to which the rest voltage decay time constant $\tau$ (e.g., the first time constant) is determined (computed), $V_{t=0}$ denotes the voltage of the device 100 at a time at which measurement of the voltage of the electronic device 100 begins (e.g., after the initial phase, if any), and $V_{t=5\ min}$ denotes the voltage of the voltage device 100 after the evaluation time period (e.g., five minutes) has elapsed.

The determining unit 412 may determine the rest voltage decay time constant $\tau$ (e.g., the first time constant) with reference to either a temperature range or a charging range of the electronic device 100. In particular, the rest voltage decay time constant $\tau$ (e.g., the first time constant) may vary for different charging values of the electronic device 100, but the rest voltage decay time constant $\tau$ (e.g., the first time constant) may not change (or only change nominally) within a predetermined charging value range (e.g., the charging range). For example, the rest voltage decay time constant $\tau$ may be similar for a change of 10% in the charging value of electronic device 100. For example, the rest voltage decay time constant $\tau$ (e.g., the first time constant) and a first time constant corresponding to the charging range of 0% to 10% may be similar to each other. Similarly, the rest voltage decay time constant $\tau$ (e.g., the first time constant) and a first time constant corresponding to the charging range of 10% to 20% may also be similar to each other. However, the first time constant corresponding to the charging range of 0% to 10% and the first time constant corresponding to the charging range of 10% to 20% may be different from each other. Therefore, the rest voltage decay time constant $\tau$ (e.g., the first time constant) may be determined differently according to different charging ranges of the electronic device 100. For example, the rest voltage decay time constant $\tau$ (e.g., the first time constant) determined in the charging range of 0% to 10% and the rest voltage decay time constant determined in the charging range of 10% to 20% may be different. The charging range may be determined by the determining unit 412.

The rest voltage decay time constant $\tau$ (e.g., the first time constant) may have different values at different temperatures of the electronic device 100 (the battery thereof). In particular, the rest voltage decay time constant $\tau$ (e.g., the first time constant) may be defined by Equation 2.

$$t = R^2 / 5 * D$$ <span style="float:right">Equation 2</span>

$\tau$ denotes the first time constant, R denotes a radius of an anode (e.g., the anode 210 of FIG. 2), and D denotes diffusivity of the anode 210. The diffusivity may be a value dependent on a temperature of the electronic device 100. For example, when R is 8$\mu$, $\tau$ obtained by D at 298K$=10^{-13.1}$ m²/s may be about 160 seconds. However, when R is 8$\mu$, $\tau$ obtained by D at 253K$=10^{-15.1}$ m²/s may be about 1600 seconds. Therefore, a reference temperature may be calculated by considering temperature dependent diffusivity.

The rest voltage decay time constant $\tau$ (e.g., the first time constant) may not appreciably change within a range of a predetermined temperature value range (e.g., the temperature range). For example, the rest voltage decay time constant may be similar for a change of 10% in the temperature of electronic device 100. For example, the rest voltage decay time constant τ (e.g., the first time constant) and a first time constant corresponding to a temperature range of 100K to 110K may be similar to each other. Similarly, the rest voltage decay time constant τ (e.g., the first time constant) and a first time constant corresponding to a temperature range of 200K to 210K may also be similar to each other. However, the first time constant corresponding to the temperature range of 100K to 110K and the first time constant corresponding to the temperature range of 200K to 210K may be different from each other.

Therefore, the rest voltage decay time constant τ (e.g., the first time constant) may be determined differently according to different temperature ranges of the electronic device 100.

For example, the rest voltage decay time constant τ (e.g., the first time constant) determined in the temperature range of 100K to 110K and the rest voltage decay time constant determined in the temperature range of 200K to 210K may be different. The temperature range may be determined by the determining unit 412.

As shown in Table 1 below, a state of health (SOH) of a battery (e.g., the battery 200 of FIG. 2) may not have any impact on the rest voltage decay time constant τ (e.g., the first time constant).

TABLE 1

| $R_{sh}$ (Ω) | τ(s) at SOH = 98% | τ(s) at SOH = 88% | Avg. relative τ (%) |
|---|---|---|---|
| 500 | 160.72 | 161.77 | 0 |
| 200 | 180.80 | 181.38 | 12.5% |
| 100 | 199.01 | 199.66 | 20% |
| 50 | 222.48 | 222.50 | 38% |
| 20 | 244.91 | 244.45 | 51% |

The SOH may be determined based on a ratio of a current battery capacity to a standard rated capacity. Furthermore, an average relative value of the rest voltage decay time constant τ (e.g., the first time constant) may be calculated as: (a first time constant of a short-circuited battery)/(a first time constant of a healthy battery) −1. The first time constant of the healthy battery used to determine the average relative value of the rest voltage decay time constant τ (e.g., the first time constant) shown in Table 1 is 161 seconds. As shown in Table 1, the rest voltage decay time constant τ (e.g., the first time constant) at a SOH of 98% and the rest voltage decay time constant at a SOH of 88% may be similar. Accordingly, the SOH may not have any appreciable impact on the rest voltage decay time constant τ (e.g., the first time constant).

The system 400 may compare 305 the first time constant with a predetermined voltage decay time constant (e.g., a second time constant) of the electronic device 100. The second time constant may be determined during a battery manufacturing stage. The system 400 may determine the second time constant with reference to either the temperature range or the charging range of the electronic device 100 (with the technique used to determine the first time constant). The second time constant may be determined with same environmental condition(s) as when the first time constant is determined. For example, when the first time constant is determined at a temperature of 100K and a charging state of 10% of the electronic device 100, a comparing unit 414 may compare a second time constant determined at the temperature of 100K and the charging state of 10% with the first time constant. As another example, when the first time constant is determined at the temperature of 100K of the electronic device 100, the comparing unit 414 may compare the second time constant determined at the temperature of 100K of the electronic device 100 with the first time constant. As another example, when the first time constant is determined at the charging state of 10% of the electronic device 100, the comparing unit 414 may compare the second time constant determined at the charging state of 10% of the electronic device 100 with the first time constant.

The system 400 may estimate 307 a short-resistance value ($R_{sh}$) (e.g., a first short-resistance value) based on a result of comparing the first time constant and the second time constant. When the first time constant is greater than the second time constant, the system 400 may estimate the first short-resistance value based on the first time constant. A change in magnitude of the first time constant depends on a short-resistance, and thus, the system 400 may estimate the first short-resistance value using a difference ($|\tau_{shorted\text{-}battery}-\tau_{healthy\text{-}battery}|$) between a first time constant of a healthy battery and a first time constant of a short-circuited battery. An estimating unit 416 may estimate the first short-resistance value according to Equation 3.

$$R_{sh}=(\tau/a)^{(1/b)} \qquad \text{Equation 3}$$

In Equation 3, a and b denote a first constant and a second constant of the battery 200, respectively. The first constant and the second constant may be a same value for batteries having similar chemical structures.

The system 400 may detect a short circuit in the battery 200 based on a result of comparing the first short-resistance value ($R_{sh}$) and a predetermined second short-resistance value. When the first short-resistance value is less than the second short-resistance value, the system 400 may detect 309 the short circuit in the battery 200. For example, when the first short-resistance value is less than 500Ω, a detecting unit 418 may detect the short circuit in the battery 200. The second short-resistance value may be predetermined by the detecting unit 418. As described later with reference to FIGS. 5A and 5B, the system 400 may indicate that the short circuit is present in the battery by comparing a magnitude of the first time constant measured after charging/discharging is completed with a magnitude of the first time constant for a healthy battery.

Figure 4:
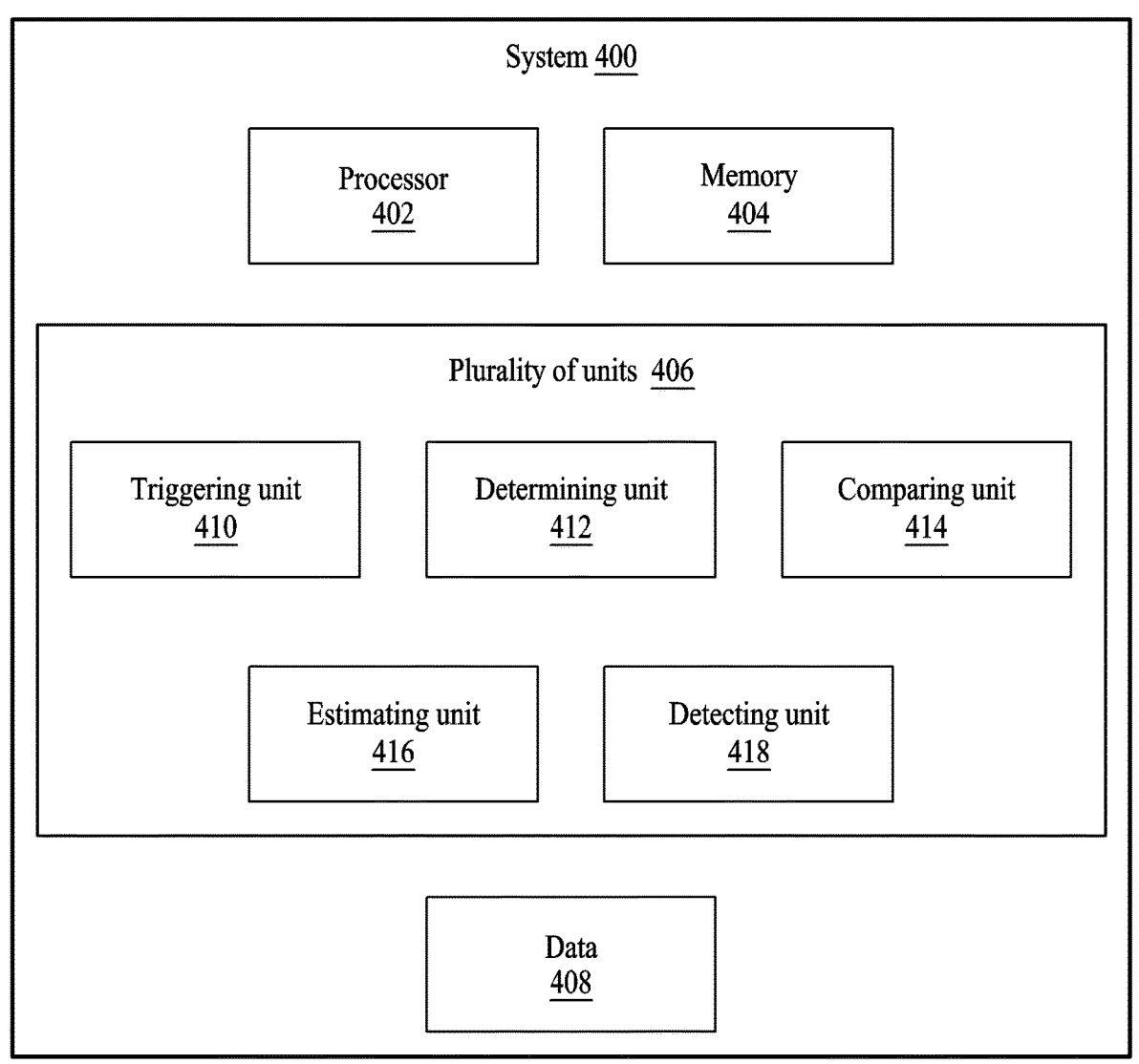
FIG. 4 illustrates an example of a system for detecting a short circuit in a battery, according to one or more embodiments.

FIG. 4 illustrates an example of a system for detecting a short circuit in a battery.

Referring to FIG. 4, the system 400 may be a system included in a BMS (e.g., the BMS 140 of FIG. 1) or a system included in an electronic device (e.g., the electronic device 100 of FIG. 1) and connected to the BMS 140. The system 400 may include a processor 402, a memory 404, a plurality of units 406, and a data unit 408. The plurality of units 406 may include the triggering unit 410, the determining unit 412, the comparing unit 414, the estimating unit 416, and the detecting unit 418. The processor 402 may be connected with the memory 404 and the plurality of units 406.

The processor 402 may include a single processing unit or a plurality of processing units. Each of the processing units may include a plurality of computing units. The processor 402 may be implemented as an arbitrary device for controlling a signal based on one or more of microprocessors, microcomputers, microcontrollers, digital signal processors, central processing units (CPUs), state machines, logic circuitry, and/or operational instructions. The processor 402 may be configured to fetch and execute computer readable instructions and data stored in the memory 404.

The memory 404 may include an arbitrary non-transitory computer-readable medium including a volatile memory (e.g., SRAM and DRAM) and/or a non-volatile memory (e.g., ROM, EPROM, a flash memory, a hard disc, an optical disc, and a magnetic disc).

The plurality of units 406 may include a routine, program (instructions), object, component, data structure, and the like, for performing a predetermined task or implementing a data type. The plurality of units 406 may be implemented as an arbitrary device or a component for controlling a signal based on a signal processor, a state machine, logic circuitry, and/or operational instructions.

The plurality of units 406 may be implemented by hardware, instructions executed by a processing unit, or a combination thereof. For example, the processing unit may include a computer, a processor (e.g., the processor 402), a state machine, a logic array, or an arbitrary device for processing instructions. The processing unit may be a universal processor or a dedicated processor to perform a predetermined function. As another example, the plurality of units 406, which is implemented as software, may be machine-readable instructions that perform an arbitrary function among the above-mentioned functions when executed by the processor 402.

The plurality of units 406 (e.g., the triggering unit 410, the determining unit 412, the comparing unit 414, the estimating unit 416, and the detecting unit 418) may communicate with each other. In an example, the plurality of units 406 may be included in the processor 402. In another example, the processor 402 may be configured to perform functions of the plurality of units 406. The data unit 408 may store data processed, received, and generated by one or more of the plurality of units 406.

The processor 130 and the memory 120 of the electronic device 100 may be connected to the BMS 140 to perform functions of the processor 402 and the memory 404 of the BMS 140.

The system 400 may estimate a short-resistance quickly and accurately by, for example, determining a first time constant within five minutes. The system 400 may not require special equipment (e.g., a probe) or accumulated data (e.g., data related to a charging/discharging cycle). The system 400 may warn a user about a potential risk and damage by accurately detecting a first short-resistance value up to 300Ω at an early stage. The system 400 may be applied to an existing device protocol.

Figure 5A:
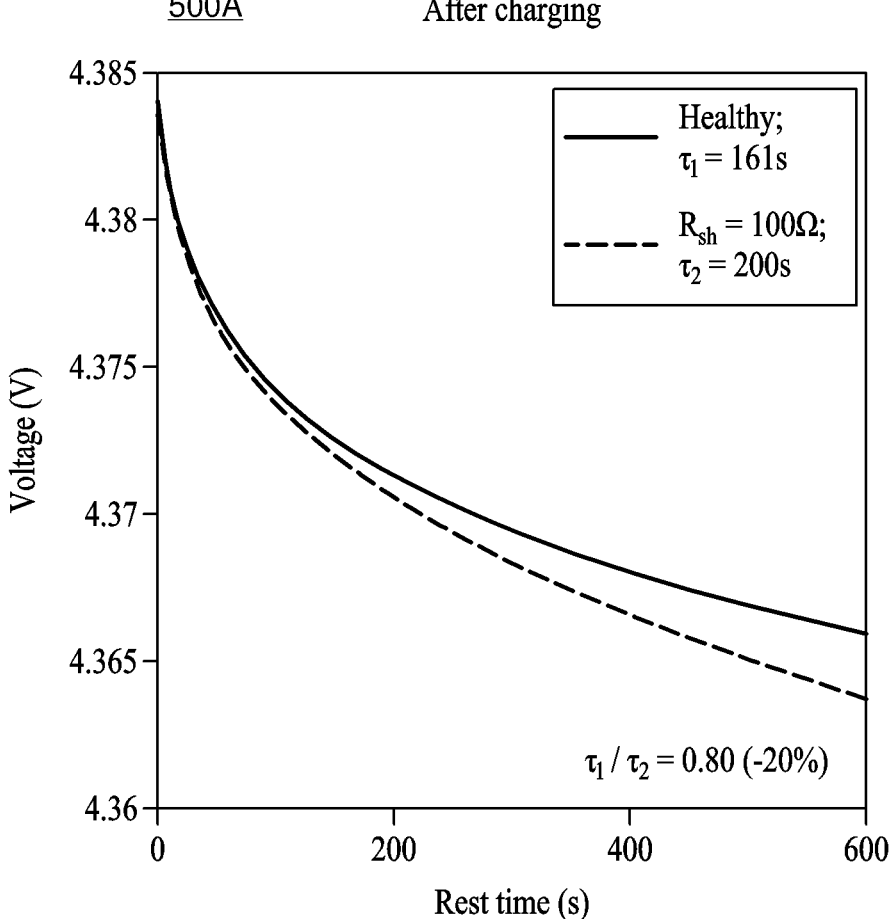
FIG. 5A illustrates an example of a change in a rest voltage decay time constant after an electronic device is charged, according to one or more embodiments.

FIG. 5A shows a graph 500A illustrating a change in a rest voltage decay time constant (e.g., a first time constant) after an electronic device is charged.

Referring to FIG. 5A, $\tau_1$ may be a first time constant after the electronic device 100 having a healthy battery is charged, and $\tau_2$ may be a first time constant after the electronic device 100 having a short-circuited battery is charged. $\tau_1$ may be 20% lower than $\tau_2$. A first short-resistance value corresponding to $\tau_2$ may be 100Ω.

Figure 5B:
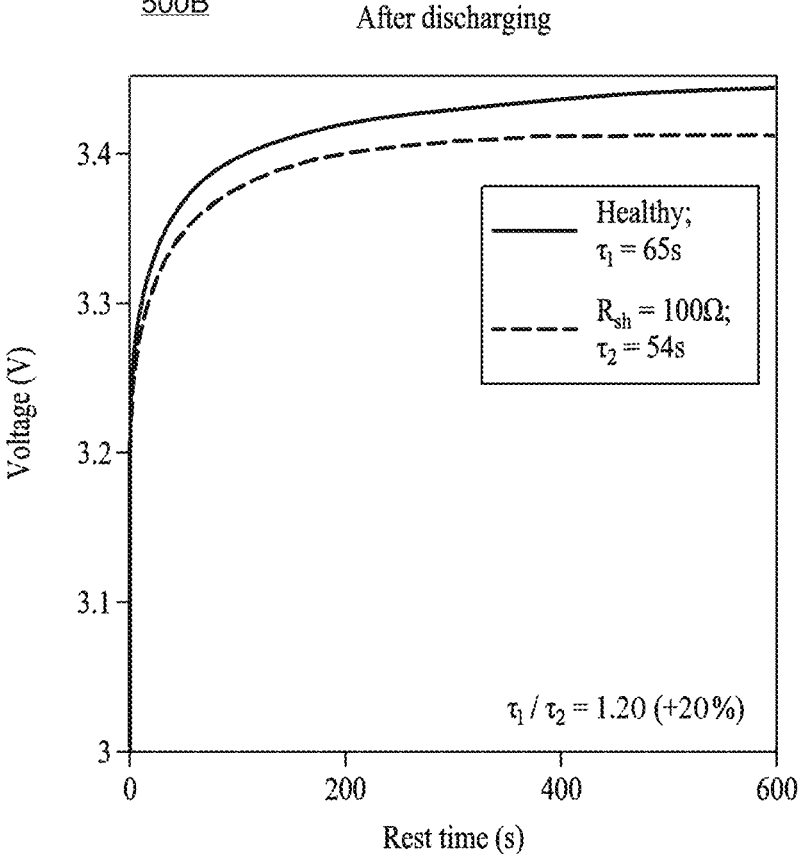
FIG. 5B illustrates an example of a change in a rest voltage decay time constant after an electronic device is discharged, according to one or more embodiments.

FIG. 5B shows a graph 500B illustrating a change in a rest voltage decay time constant (e.g., a first time constant) after the electronic device is discharged.

Referring to FIG. 5B, $\tau_1$ may be a first time constant after the electronic device 100 having a healthy battery is discharged, and $\tau_2$ may be a first time constant after the electronic device 100 having a short-circuited battery is discharged. $\tau_1$ may be 20% higher than $\tau_2$. A first short-resistance value corresponding to $\tau_2$ may be 100Ω.

Figure 6:
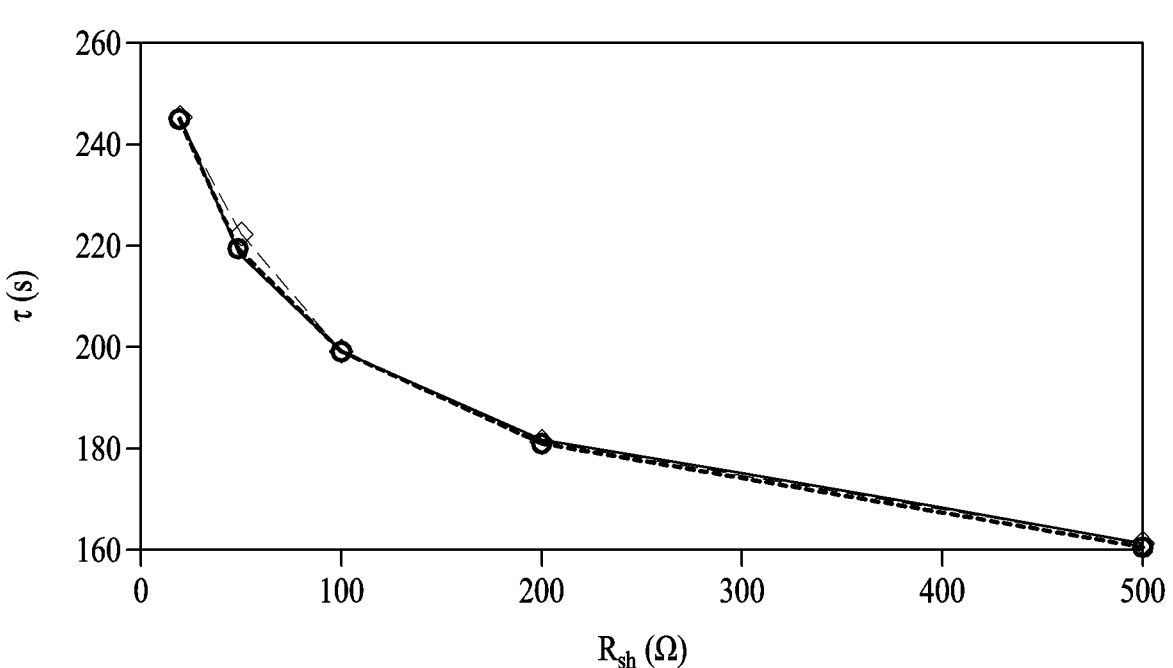
FIG. 6 illustrates an example of a change in a rest voltage decay time constant of a short-circuited battery, according to one or more embodiments.

FIG. 6 shows a graph 600 of a change in a rest voltage decay time constant (e.g., a first time constant) of an example short-circuited battery.

Referring to FIG. 6, a first short-resistance value of 100Ω significantly (e.g., 12.5%) increases the first time constant. Hence, detecting a short circuit in a battery 200 early and estimating a short-resistance at an early stage may be important.

The system 400 may accurately detect the short circuit in the battery 200 as shown in Table 2. Table 2 shows accuracy of the first short-resistance value estimated according to the first time constant illustrated in FIG. 6.

TABLE 2

| $\tau$ (s) | Actually used $R_{sh}$ (Ω) | Estimated $R_{sh}$ (Ω) | Accuracy (%) |
|---|---|---|---|
| 157.0 | Healthy | 617.75 | 100% |
| 172.2 | 300 | 305.65 | 98.0% |
| 179.8 | 225 | 219.50 | 97.5% |
| 199.8 | 100 | 98.62 | 98.6% |
| 232.5 | 30 | 31.01 | 97.0% |

Figure 7:
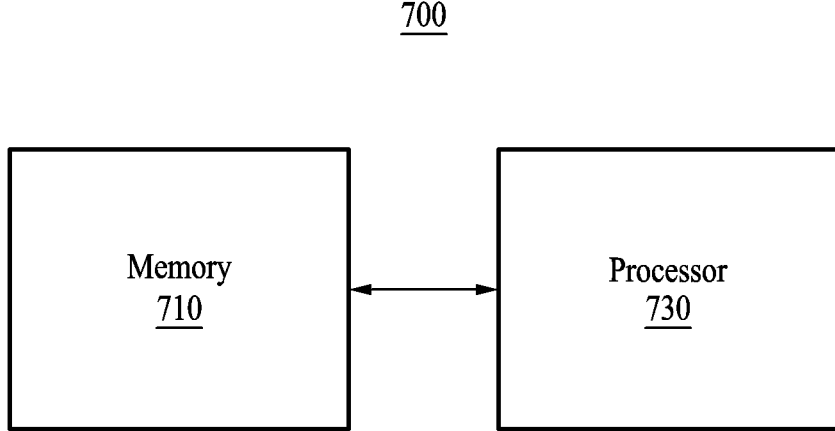
FIG. 7 illustrates an example of a detection device, according to one or more embodiments.

FIG. 7 illustrates an example of a detection device. Referring to FIG. 7, a detection device 700 may include a memory 710 and a processor 730. The detection device 700 may be, or maybe included in, a personal computer (PC), a data server, or a portable device. A portable device may be, for example, a laptop computer, a mobile phone, a smartphone, a tablet PC, a mobile Internet device (MID), a personal digital assistant (PDA), an enterprise digital assistant (EDA), a digital still camera, a digital video camera, a portable multimedia player (PMP), a personal or portable navigation device (PND), a handheld game console, an e-book, a smart device, or the like. A smart device may be, for example, a smart watch, a smart band, a smart ring, etc.

The memory 710 may store instructions (or programs) executable by the processor 730. For example, the instructions may include instructions to perform an operation of the processor 730 and/or an operation of each element of the processor 730.

The memory 710 may be implemented as a volatile or non-volatile memory device. The volatile memory device may be implemented as dynamic random access memory (DRAM), static random access memory (SRAM), thyristor RAM (T-RAM), zero capacitor RAM (Z-RAM), or twin transistor RAM (TTRAM). The non-volatile memory device may be implemented as electrically erasable programmable read-only memory (EEPROM), flash memory, magnetic RAM (MRAM), spin-transfer torque (STT)-MRAM, conductive bridging RAM (CBRAM), ferroelectric RAM (Fe-RAM), phase change RAM (PRAM), resistive RAM (RRAM), nanotube RRAM, polymer RAM (PoRAM), nano floating gate Memory (NFGM), holographic memory, a molecular electronic memory device, and/or insulator resistance change memory.

The processor 730 may execute a computer-readable code (for example, software) stored in the memory 710 and instructions triggered by the processor 730. The processor 730 may be a data processing device implemented by hardware including a circuit having a physical structure to perform desired operations. The desired operations may include code or instructions included in a program. For example, the hardware-implemented data processing device may include a microprocessor, a CPU, a processor core, a multi-core processor, a multiprocessor, an application-specific integrated circuit (ASIC), and a field-programmable gate array (FPGA).

An operation performed by the processor 730 may be substantially the same as those of the system 400 described with reference to FIGS. 1 through 6. The processor 730 may be substantially the same as the processor 402 of FIG. 4, and the memory 710 may be substantially the same as the memory 404 of FIG. 4. Thus, a more detailed description thereof is not included here, for brevity.

The computing apparatuses, the electronic devices, the processors, the memories, the displays, the information output system and hardware, the storage devices, and other apparatuses, devices, units, modules, and components described herein with respect to FIGS. 1-7 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-7 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A device comprising:
one or more processors;
a memory storing instructions configured to cause the one or more processors to:
    trigger a rest phase of a battery;
    determine a first time constant related to a rest voltage of the battery by comparing between a voltage of the battery and a maximum voltage in an evaluation time period of the rest phase;
    generate a first short-resistance value based on a result of comparing the first time constant with a second time constant related to a voltage of the battery;
    generate a determination indicating a short circuit in the battery based on a result of comparing the first short-resistance value and a second short-resistance value when the first short-resistance value is less than the second short-resistance value; and
    control protection of the battery based on the determination indicating whether the short circuit has occurred in the battery,
    wherein the first time constant and the second time constant are each determined with reference to either a temperature range or a charging range of the battery.

2. The device of claim 1, wherein the instructions are further configured to cause the one or more processors to:
    trigger the rest phase in response to a user input; or
    trigger the rest phase based on a triggering time period.

3. The device of claim 1, wherein the instructions are further configured to cause the one or more processors to determine the first time constant based on voltage information of the rest phase obtained during the evaluation time period of the rest phase.

4. The device of claim 1, wherein the instructions are further configured to cause the one or more processors to estimate the first short-resistance value based on the first time constant when the first time constant is greater than the second time constant.

5. The device of claim 1, wherein the rest phase corresponds to either:
    the battery not supplying current to the device; or
    the battery supplying current to the device that is less than or equal to a predetermined threshold.

6. The device of claim 1, wherein the rest phase is triggered during either a charging state or a discharging state.

7. The method of claim 1, further comprising outputting a signal generated based on the determination indicating the short circuit has occurred in the battery.

8. The method of claim 1, wherein the first time constant is a period of time taken for the voltage to drop to a threshold from the maximum voltage.

9. The method of claim 1, wherein the comparing is based on a temperature of the device and a current charging state of the battery corresponding to the rest phase, the first time constant with a second time constant related to a voltage of the battery, wherein the second time constant is preset value.

10. A method of detecting a short circuit in a battery, the method comprising:
    triggering a rest phase of the battery;
    determining a first time constant related to a rest voltage of the battery when the battery is in a rest phase by comparing between a voltage of the battery and a maximum voltage in an evaluation time period of the rest phase;
    generating a first short-resistance value based on a result of comparing the first time constant with a second time constant related to a voltage of the battery; and
    generating a determination indicating a short circuit in the battery based on a result of comparing the first short-resistance value and a second short-resistance value when the first short-resistance value is less than the second short-resistance value; and
    controlling protection of the battery based on the determination indicating whether the short circuit has occurred in the battery,
    wherein the first time constant and the second time constant are determined with reference to either a temperature range or a charging range of the battery.

11. The method of claim 10, further comprising: allowing the rest phase to be triggered on-demand based on a user input.

12. The method of claim 10, wherein the first time constant is determined based on voltage information of the rest phase during the evaluation time period related to voltage information.

13. The method of claim 12, further comprising: the maximum voltage is measured from the battery at the beginning of the evaluation time period.

14. The method of claim 10, wherein the rest phase comprises a period of time defined by ending charging of the battery based on starting of the rest phase.

15. The method of claim 14, wherein the rest phase includes an initial phase, and wherein the maximum voltage is measured based on the ending of the initial phase.

16. The method of claim 10, wherein the determination of the short circuit for the battery is based on the first short-resistance value being less than the second short-resistance value.

17. A method comprising:
    triggering a rest phase of a battery;
    generating a short circuit estimation of the battery during the rest phase of the battery;
    generating, during the rest phase after a charging or discharging of the battery has ended and that the rest phase of the battery has been triggered, voltage information;
    generating, based on the voltage information and range information of the battery comprising a temperature range of the battery or a charging range of the battery, a determination indicating whether a short circuit condition exists in the battery; and controlling protection of the battery based on the determination indicating whether the short circuit has occurred in the battery, wherein the voltage information comprises comparing between a maximum voltage value and a voltage value, both measured during the rest phase.

18. The method of claim 17, wherein the generating the determination comprises:

generating a first resistance value based on the range;

comparing the first resistance value with a predetermined second resistance value; and determining the short circuit condition exists when the first resistance value is less than the predetermined second resistance value.

* * * * *